United States Patent
Tu et al.

(10) Patent No.: US 7,565,984 B2
(45) Date of Patent: Jul. 28, 2009

(54) SCREW CAP FOR A PORTABLE ELECTRONIC DEVICE

(75) Inventors: Ying Liang Tu, Shenzhen (CN); Xiao Yu Tan, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 710 days.

(21) Appl. No.: 10/921,705

(22) Filed: Aug. 18, 2004

(65) Prior Publication Data

US 2005/0115732 A1    Jun. 2, 2005

(30) Foreign Application Priority Data

Nov. 29, 2003   (CN) .................. 2003 2 01188369 U

(51) Int. Cl.
*B65D 53/02* (2006.01)
(52) U.S. Cl. ............... 220/378; 220/804; 220/254.1; 215/355
(58) Field of Classification Search ............ 215/355, 215/364; 220/378, 254.1, 806, 803, 804
See application file for complete search history.

(56) References Cited

U.S. PATENT DOCUMENTS

| | | | | |
|---|---|---|---|---|
| 844,400 A | * | 2/1907 | Radbruch | 215/364 |
| 2,674,390 A | * | 4/1954 | Meyer | 220/804 |
| 2,674,472 A | * | 4/1954 | Meyer | 215/352 |
| 3,599,820 A | * | 8/1971 | Lee | 215/364 |
| 3,874,541 A | * | 4/1975 | Lagneaux et al. | 215/253 |
| 4,515,283 A | * | 5/1985 | Suzuki | 215/270 |
| 5,944,208 A | * | 8/1999 | Gale | 215/296 |

* cited by examiner

*Primary Examiner*—Anthony D Stashick
*Assistant Examiner*—James N Smalley
(74) *Attorney, Agent, or Firm*—Wei Te Chung

(57) ABSTRACT

A screw cap for covering a head of a screw in a screw hole (20) of a housing (2) of a portable electronic device. The screw hole includes a wide upper portion (202) and a narrow lower portion (204). The screw cap includes a main body (12) and an elastic ring (14). The main body includes a wide head (122) and an adjoining narrow cylindrical body (124). An upper first groove (1242) and a lower second groove (1243) are defined in the cylindrical body. The first groove is deeper than the second groove. When the elastic ring is engaged in the second groove, the screw cap can be interferentially engaged in the screw hole. When the screw cap is pushed so that the elastic ring is engaged in the first groove, the screw cap can be easily removed from the screw hole.

3 Claims, 5 Drawing Sheets

SCREW CAP FOR A PORTABLE ELECTRONIC DEVICE

BACKGROUND OF THE INVENTION

1. Field of the Invention

The present invention generally relates to screw caps that cover heads of screws, and more particularly to screw caps for portable electronic devices. The invention relates to a contemporarily filed application titled "EXPANDABLE SCREW COVER" and having the same assignee with the instant invention.

2. Prior Art

Nowadays, major parts of a portable electronic device such as a mobile phone are generally attached together with screws. Where one of the parts is the housing of the mobile phone, the head of each screw is conventionally exposed at an outer surface of the housing. This detracts from the aesthetic appearance of the mobile phone. Therefore in more recent times, manufacturers have configured a motherboard to be attached to a first half-shell of a housing of the mobile phone with screws, with a second half-shell of the housing being attached to the first half-shell by other means such as snap-fitting. In this way, the heads of the screws are hidden within the housing. For example, ERICSSON's mobile phone model no. T68 adopts the above-mentioned newer type of securing means.

However, assembly of the above-mentioned new kind of portable electronic device is much more complicated than assembly of the more conventional, less aesthetic type of portable electronic device. Therefore, some modern portable electronic devices still adopt securing of an upper cover to a lower cover thereof with screws. In addition, a cylindrical cap made of soft plastic is engaged in each screw hole so that it covers the screw head. The diameter of the cap is slightly larger than the diameter of the screw hole, so that the cap interferentially fits in the screw hole and does not fall out. For example, SAMSUNG's mobile phone model no. N188 adopts this type of aesthetic securing means. However, in disassembly, a hard, sharp tool needs to be inserted between the cap and the housing. The caps have to be removed from the housing one by one, which is very laborious. Moreover, because the caps are made of soft plastic, they are easily damaged and distorted during normal use of the portable electronic device. This not only reduces their aesthetic appearance, but can also make disassembly more difficult and inconvenient.

Therefore, a screw cap for a portable electronic device which overcomes the above-described disadvantages is desired.

SUMMARY OF THE INVENTION

Accordingly, an object of the present invention is to provide a screw cap for a portable electronic device which enables the portable electronic device to be conveniently assembled and disassembled.

To achieve the above-mentioned object, a screw cap for a portable electronic device of the present invention comprises a main body and an elastic ring. The main body comprises a head located a top thereof, and a cylindrical body adjoining a bottom of the head. An outer diameter of the cylindrical body is less than an outer diameter of the head. A first groove and a second groove are defined in circumferential surface of the cylindrical body. The first groove is near a top of the cylindrical body, and is deeper than the second groove. When the elastic ring is engaged in the second groove, the screw cap can be interferentially engaged in a screw hole of a housing of the portable electronic device. When the screw cap is pushed so that the elastic ring is engaged in the first groove, the screw cap can be easily removed from the screw hole.

Other objects, advantages and novel features of the invention will become more apparent from the following detailed description when taken in conjunction with the accompanying drawings, in which:

DETAILED DESCRIPTION OF THE INVENTION

Figure 1:
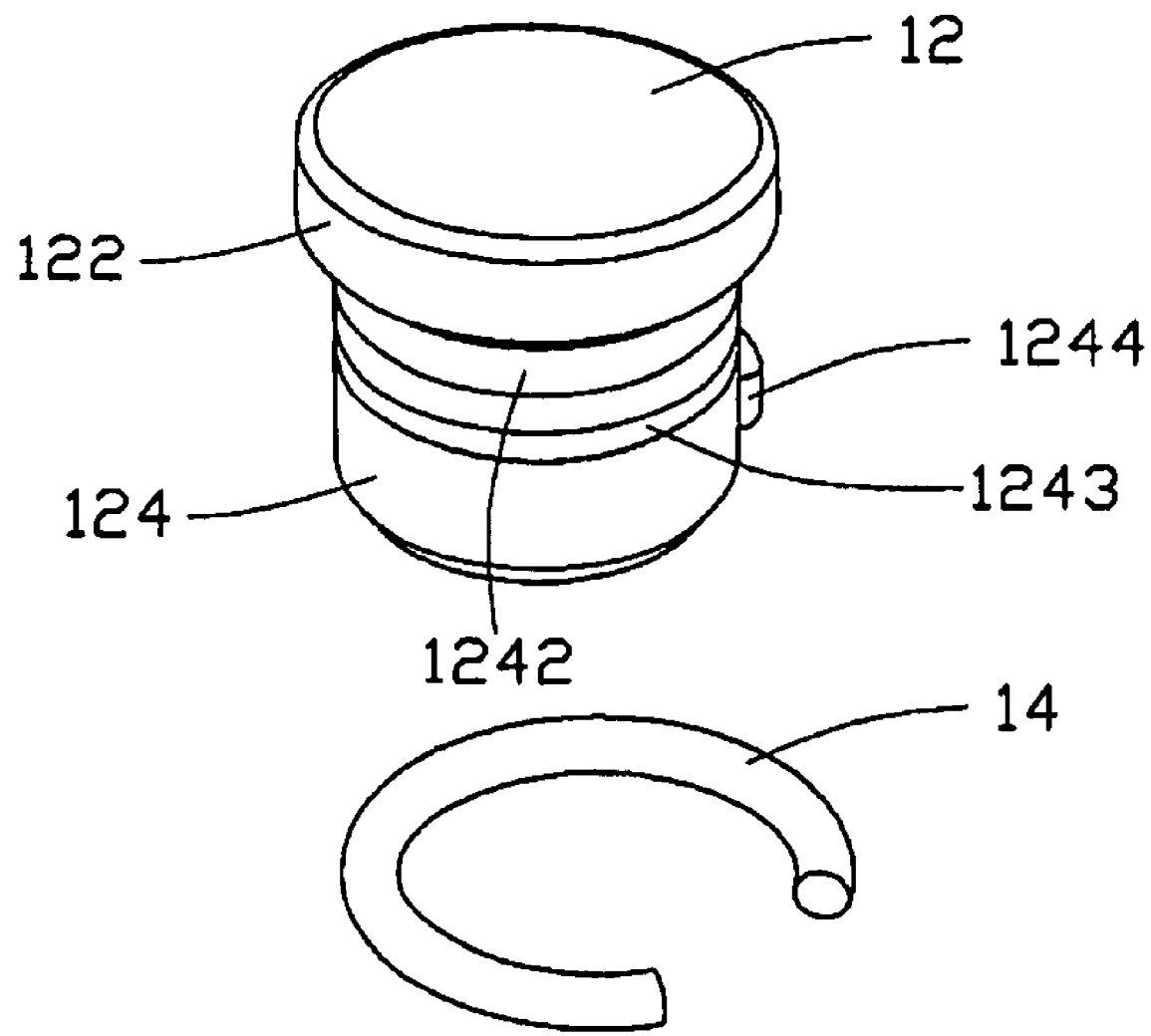
FIG. 1 is an exploded, isometric view of a screw cap of a portable electronic device in accordance with a preferred embodiment of the present invention.
Figure 4:
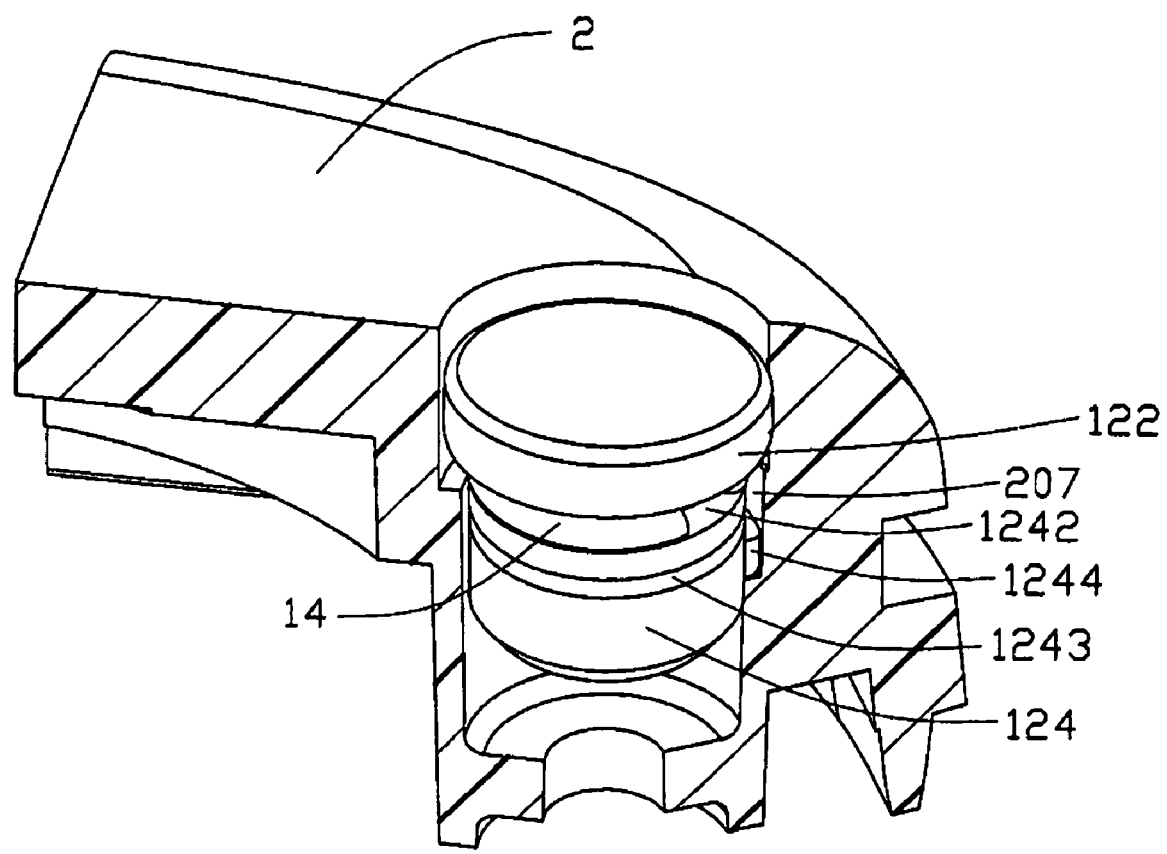
FIG. 4 is similar to FIG. 3, but showing the screw cap accommodated in the housing in a second position.
Figure 5:
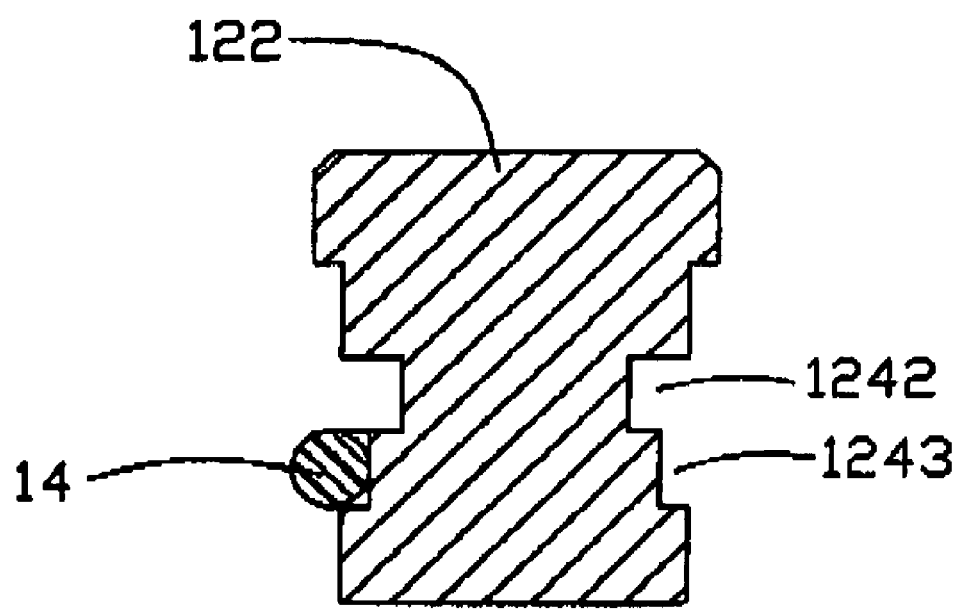
FIG. 5 is a sectional view showing the screw cap with an elastic ring engaging in a second groove thereof.

Referring to FIG. 1, a screw cap of a portable electronic device in accordance with the preferred embodiment of the present invention comprises a main body 12 and an elastic ring 14 that has a gap (not labeled) therein. The main body 12 includes a head 122 and a cylindrical body 124. The head 122 is located at the top of the main body 12, with the cylindrical body 124 adjoining a bottom of the head 122. The head 122 and the cylindrical body 124 can be integrally formed together at the same time. An outer diameter of the cylindrical body 124 is less than an outer diameter of the head 122. An upper first groove 1242 and a lower second groove 1243 are respectively defined in a circumferential surface of the cylindrical body 124. The first groove 1242 is near a top of the cylindrical body 124, and is deeper than the second groove 1243. A stop block 1244 is formed on the cylindrical body 124. The stop block 1244 protrudes from the circumferential surface of the cylindrical body 124 below the second groove 1243. The elastic ring 14 can be engaged in the first groove 1242 or the second groove 1243, and can be taken out from the first or second grooves 1242, 1243 by manipulating the elastic ring 14 at the gap thereof. As shown in FIG. 5, when the elastic ring 14 is engaged in the second groove 1243, an outer diameter of the elastic ring 14 is greater than the diameter of the head 122. As shown in FIG. 4, when the elastic ring 14 is engaged in the first groove 1242, the outer diameter of the elastic ring 14 is less than the diameter of the head 122.

Figure 2:
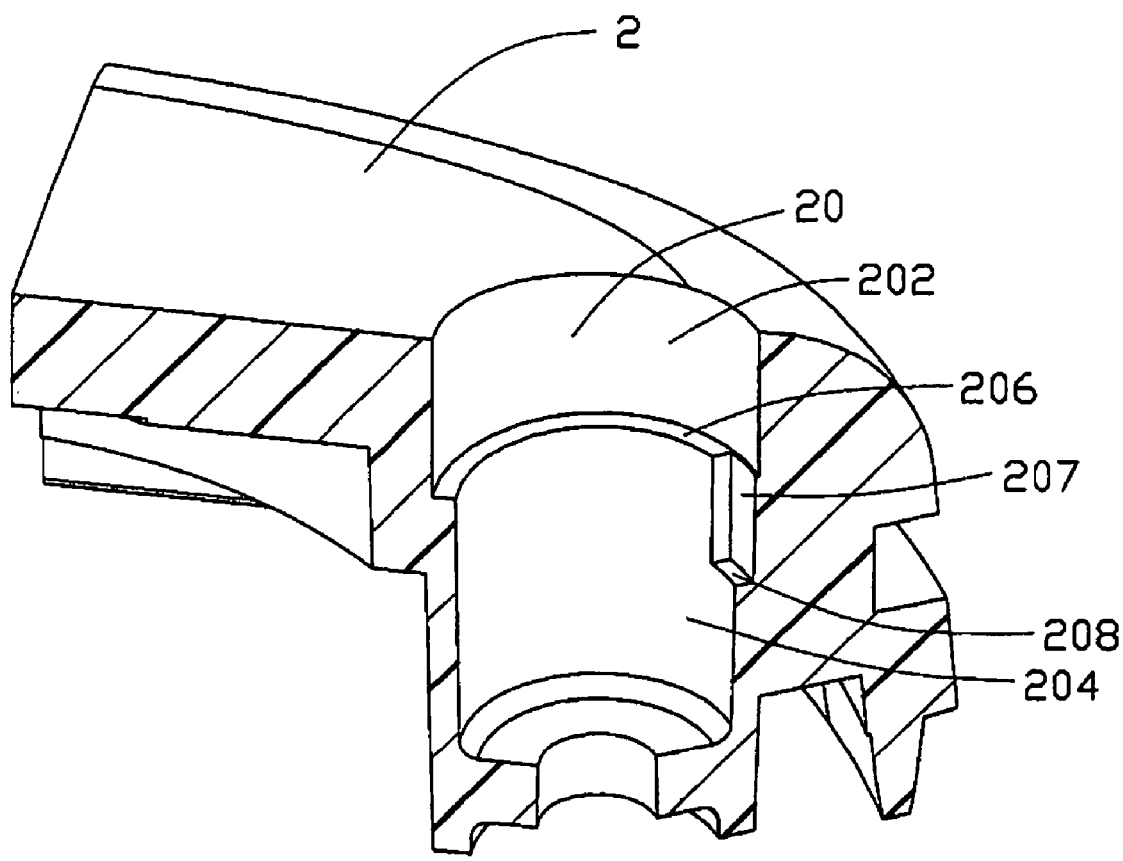
FIG. 2 is an isometric, cut-away view of part of a housing of a portable electronic device that utilizes the screw cap of FIG. 1.

Referring to FIG. 2, the portable electronic device utilizing the screw cap comprises a housing 2, and a screw hole 20 defined in the housing 2. The screw hole 20 is stepped, and thereby comprises an upper portion 202 and a lower portion 204. A diameter of the upper portion 202 is greater than a diameter of the lower portion 204. The diameter of the upper portion 202 is slightly greater than the diameter of the head 122, so that the head 122 can be fittingly received in the upper portion 202. The diameter of the lower portion 204 is slightly greater than the diameter of the cylindrical body 124, so that the cylindrical body 124 can be fittingly received in the lower portion 204. An annular supporting step 206 is defined at the junction of the upper portion 202 and the lower portion 204. A vertical sliding groove 207 is defined in an inner wall of the housing 2 at the lower portion 204, with a top extremity of the sliding groove 207 being at the supporting step 206. A stop step 208 is defined at a bottom of the sliding groove 207. The stop block 1244 of the cylindrical body 124 can slide in the sliding groove 207 and can be stopped by the stop step 208. In addition, the outer diameter of the elastic ring 14 in an uncompressed state in the second groove 1243 is slightly greater than the diameter of the upper portion 202.

Figure 3:
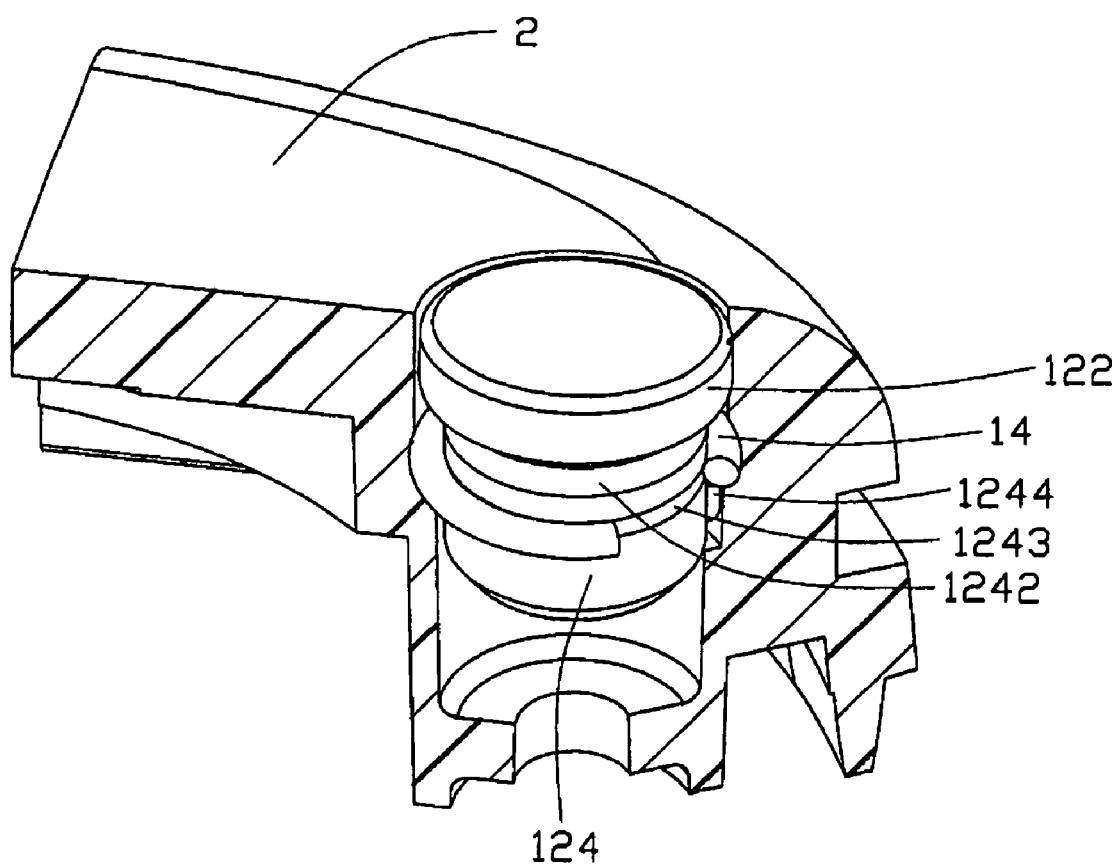
FIG. 3 is similar to FIG. 2, but showing the screw cap of FIG. 1 attached in the housing in a first position.

Referring also to FIG. 3, in assembly, a screw (not shown) is mounted in the screw hole 20 of the housing 2. The elastic ring 14 is invaginated into the second groove 1243 of the main body 12. The screw cap is then inserted into the screw hole 20. The head 122 is pressed down. The main body 12 slides into the screw hole 20, with the elastic ring 14 interferentially sliding down along the upper portion 202, and the stop block 1244 sliding down in the sliding groove 207. The head 122 is thus pressed until a top face thereof is level with or lower than a top face of the housing 2. This position can be attained because a distance between the second groove 1243 and the top face of the head 122 is less than a depth of the upper portion 202 of the screw hole 20. In addition, because the outer diameter of the elastic ring 14 in the uncompressed state in the second groove 1243 is slightly greater than the diameter of the upper portion 202, the screw cap is tightly fixed in the screw hole 20.

Referring to FIG. 4, in disassembly, the head 122 is pressed down. The elastic ring 14 slides with the main body 12 in the upper portion 202 toward the supporting step 206. Because the outer diameter of the elastic ring 14 in the second groove 1243 is greater than the diameter of the lower portion 204 of the screw hole 20, the elastic ring 14 is stopped by the supporting step 206. When the head 122 is continued to be pressed, the cylindrical body 124 interferentially slides down through the elastic ring 14. Thus the elastic ring 14 is disengaged from the second groove 1243, and moves relative to the cylindrical body 124 until it eventually engages in the first groove 1242. In this position, because the outer diameter of the elastic ring 14 in the first groove 1242 is less than the diameter of the head 122, the screw cap is in no longer tightly fixed in the screw hole 20. The portable electronic device is then inverted, so that the screw cap drops out from the screw hole 20.

It is believed that the present invention and its advantages will be understood from the foregoing description, and it will be apparent that various changes may be made thereto without departing from the spirit and scope of the invention or sacrificing all of its material advantages. The examples hereinbefore described are merely preferred or exemplary embodiments of the invention.

We claim:

1. A screw cap for a portable electronic device, comprising:
a main body comprising a head and a cylindrical body having an outer cylindrical surface, the head being located at a top of the main body, the cylindrical body adjoining a bottom of the head, a diameter of the outer cylindrical surface being less than a diameter of the head, the outer cylindrical surface defining a first circumferential groove and a second circumferential groove, the first groove being at a top of the cylindrical body and being deeper than the second groove; and
an elastic ring;
wherein the elastic ring is engagable in, and moveable from, the first groove and the second groove, an outer diameter of the elastic ring is less than the diameter of the head when the elastic ring is engaged in the first groove, and an outer diameter of the elastic ring is greater than the largest diameter of the head when the elastic ring is engaged in the second groove.

2. The screw cap as claimed in claim 1, wherein a gap is defined in the elastic ring.

3. The screw cap as claimed in claim 2, wherein a stop block is formed on the cylindrical body.

* * * * *